United States Patent
Degai et al.

(10) Patent No.: US 11,315,800 B2
(45) Date of Patent: Apr. 26, 2022

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Motomu Degai, Toyama (JP);
Kimihiko Nakatani, Toyama (JP);
Takashi Nakagawa, Toyama (JP);
Takayuki Waseda, Toyama (JP);
Yoshitomo Hashimoto, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/953,471

(22) Filed: Nov. 20, 2020

(65) Prior Publication Data
US 2021/0159088 A1    May 27, 2021

(30) Foreign Application Priority Data

Nov. 22, 2019    (JP) .............................. JP2019-211137

(51) Int. Cl.
*H01L 21/321*    (2006.01)
*H01L 21/3213*    (2006.01)
*H01L 21/67*    (2006.01)

(52) U.S. Cl.
CPC .. *H01L 21/32135* (2013.01); *H01L 21/67069* (2013.01)

(58) Field of Classification Search
None
See application file for complete search history.

(56) References Cited

U.S. PATENT DOCUMENTS

| | | |
|---|---|---|
| 6,391,803 B1 | 5/2002 | Kim et al. |
| 2010/0186774 A1 | 7/2010 | Miya et al. |
| 2011/0059600 A1 | 3/2011 | Sakai et al. |
| 2016/0196969 A1 | 7/2016 | Berry, III et al. |
| 2016/0293398 A1 | 10/2016 | Danek et al. |
| 2016/0293432 A1 | 10/2016 | Ranjan et al. |
| 2017/0316947 A1 | 11/2017 | Moriya et al. |

(Continued)

FOREIGN PATENT DOCUMENTS

| | | |
|---|---|---|
| JP | 2011-068984 A | 4/2011 |
| JP | 2019-160962 A | 9/2019 |

(Continued)

OTHER PUBLICATIONS

Taiwanese Office Action dated Sep. 14, 2021 for Taiwanese Patent Application No. 109139255.

(Continued)

*Primary Examiner* — Roberts P Culbert
(74) *Attorney, Agent, or Firm* — Volpe Koenig

(57) ABSTRACT

There is provide a technique that includes: etching a base exposed on a surface of a substrate by performing a cycle a predetermined number of times, the cycle including non-simultaneously performing: (a) forming a modified layer on a surface of the base by supplying a modifying agent to the base; and (b) causing a reaction between a halogen-containing radical and the base by supplying a halogen-containing gas to the modified layer such that the modified layer reacts with the halogen-containing gas to generate the halogen-containing radical.

19 Claims, 7 Drawing Sheets

(56) References Cited

U.S. PATENT DOCUMENTS

2019/0279877 A1    9/2019    Murakami et al.

FOREIGN PATENT DOCUMENTS

KR    10-2010-0071961 A    6/2010
WO       2009/037991 A1    3/2009

OTHER PUBLICATIONS

Singapore Written Opinion dated Oct. 7, 2021 for Singapore Patent Application No. 10202011563T.
Singapore Search Report dated Oct. 7, 2021 for Singapore Patent Application No. 10202011563T.
Japanese Office Action dated Jan. 28, 2022 for Japanese Patent Application No. 2019-211137.
Korean Office Action dated Feb. 14, 2022 for Korean Patent Application No. 10-2020-0156252.

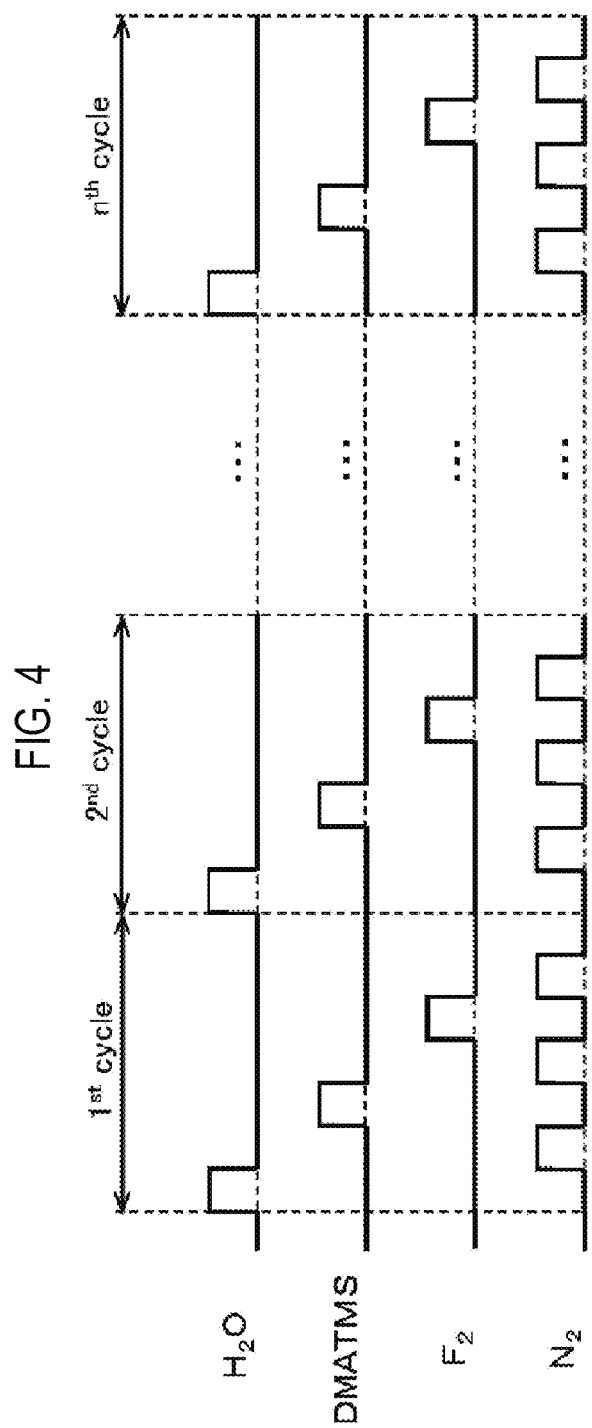

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2019-211137, filed on Nov. 22, 2019, the entire contents of which are incorporated herein by reference.

TECHNICAL FIELD

The present disclosure relates to a method of manufacturing a semiconductor device, a substrate processing apparatus, and a recording medium.

BACKGROUND

In the related art, as a process of manufacturing a semiconductor device, a process of etching a base exposed on a surface of a substrate is carried out.

SUMMARY

Some embodiments of the present disclosure provide a technique capable of enhancing etching controllability.

According to an embodiment of the present disclosure, there is provided a technique that includes: etching a base exposed on a surface of a substrate by performing a cycle a predetermined number of times, the cycle including non-simultaneously performing: (a) forming a modified layer on a surface of the base by supplying a modifying agent to the base; and (b) casing a reaction between a halogen-containing radical and the base by supplying a halogen-containing gas to the modified layer such that the modified layer reacts with the halogen-containing gas to generate the halogen-containing radical.

BRIEF DESCRIPTION OF DRAWINGS

The accompanying drawings, which are incorporated in and constitute a part of the specification, illustrate embodiments of the present disclosure.

FIG. 4 is a diagram illustrating a gas supply sequence according to an embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An Embodiment of the Present Disclosure

An embodiment of the present disclosure will now be described mainly with reference to FIGS. 1 to 4.

(1) Configuration of the Substrate Processing Apparatus

Figure 1:
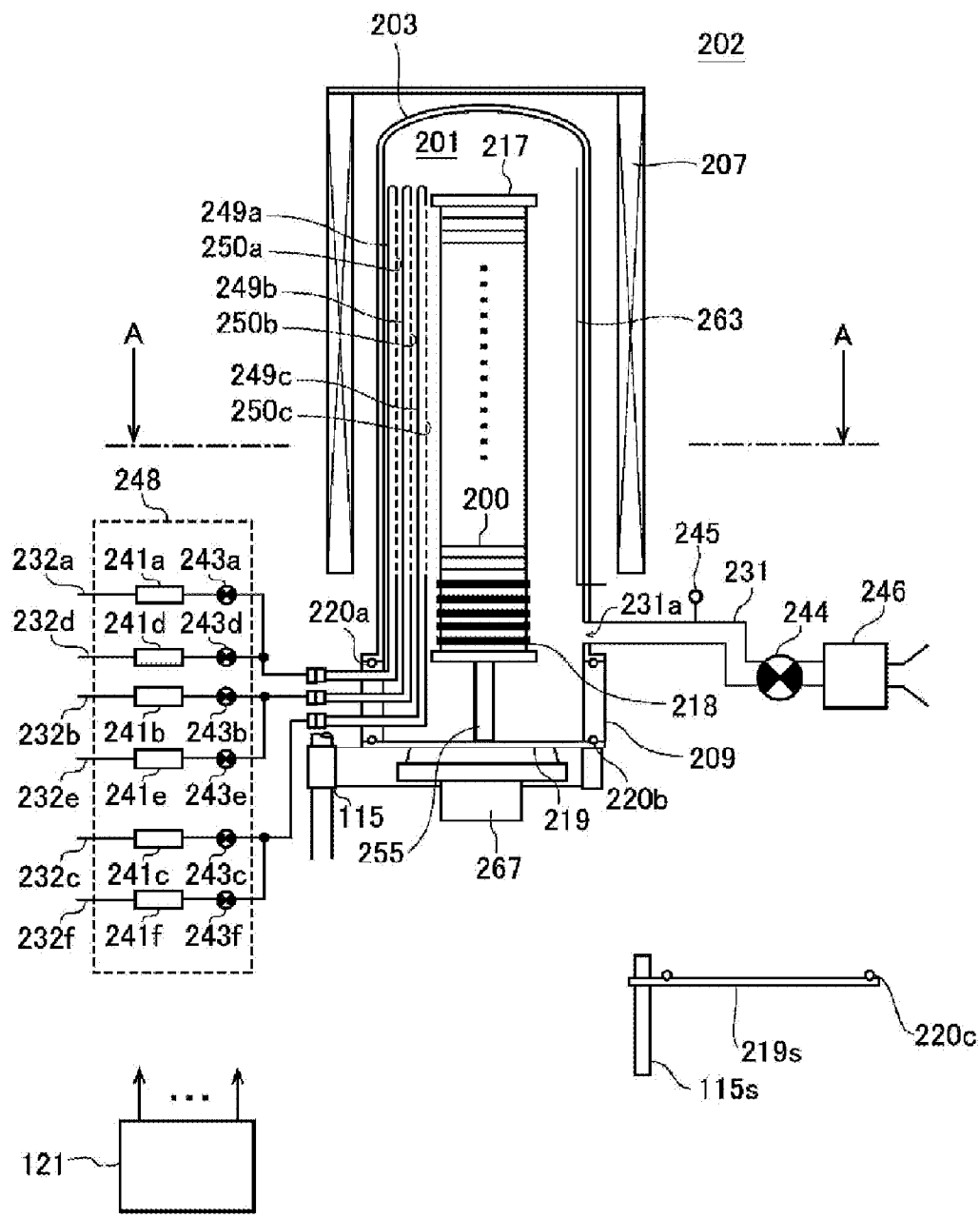
FIG. 1 is a schematic configuration diagram of a vertical type process furnace of a substrate processing apparatus suitably used in an embodiment of the present disclosure, in which a portion of the process furnace 202 is shown in a vertical cross-sectional view.

As illustrated in FIG. 1, a process furnace 202 includes a heater 207 as a heating mechanism (temperature adjustment part). The heater 207 has a cylindrical shape and is supported by a holding plate to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material, for example, quartz ($SiO_2$), silicon carbide (SiC) or the like, and has a cylindrical shape with its upper end closed and its lower end opened. A manifold 209 is disposed below the reaction tube 203 in a concentric relationship with the reaction tube 203. The manifold 209 is made of a metal material, for example, stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. Similar to the heater 207, the reaction tube 203 is vertically installed. A processing vessel (reaction vessel) mainly includes the reaction tube 203 and the manifold 209. A process chamber 201 is formed in a hollow cylindrical portion of the processing vessel. The process chamber 201 is configured to be capable of accommodating wafers 200 as substrates. The processing of the wafers 200 is performed in the process chamber 201.

Nozzles 249a to 249c as first to third supply parts are installed in the process chamber 201 to penetrate a sidewall of the manifold 209. The nozzles 249a to 249c will be referred to as first to third nozzles, respectively. The nozzles 249a to 249c are each made of a heat resistant material such as quartz, SiC or the like. Gas supply pipes 232a to 232c are connected to the nozzles 249a to 249c respectively. The nozzles 249a to 249c are different nozzles, in which each of the nozzles 249a to 249c is installed adjacent to the nozzle 249b.

Mass flow controllers (MFCs) 241a to 241c, which are flow rate controllers (flow rate control parts), and valves 243a to 243c, which are opening/closing valves, are installed at the gas supply pipes 232a to 232c sequentially from the corresponding upstream sides of gas flow, respectively. Gas supply pipes 232d to 232f are connected to the gas supply pipes 232a to 232c at the downstream side of the valves 243a to 243c respectively. MFCs 241d to 241f and valves 243d to 243f are installed at the gas supply pipes 232d to 232f sequentially from the corresponding upstream sides of gas flow, respectively. The gas supply pipes 232a to 232f are made of a metal material such as stainless steel (SUS) or the like.

Figure 2:
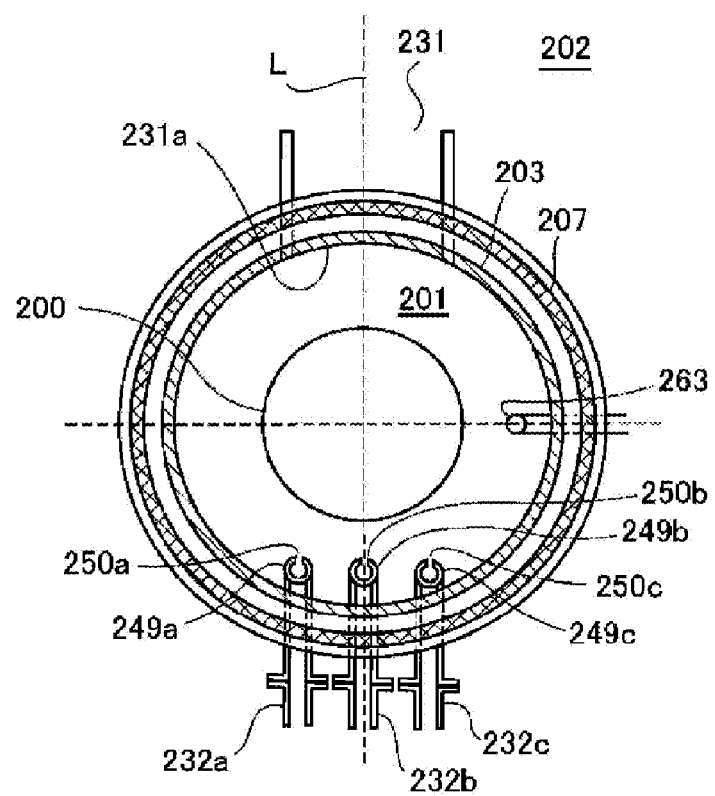
FIG. 2 is a schematic configuration diagram of a vertical type process furnace of the substrate processing apparatus suitably used in an embodiment of the present disclosure, in which a portion of the process furnace 202 is shown in a cross-sectional view taken along line A-A in FIG. 1.

As illustrated in FIG. 2, the nozzles 249a to 249c are disposed in a space with an annular plan-view shape between the inner wall of the reaction tube 203 and the wafers 200 such that the nozzles 249a to 249c extend upward along an arrangement direction of the wafers 200 from a lower portion to an upper portion of the inner wall of the reaction tube 203. Specifically, the nozzles 249a to 249c are installed at a lateral side of a wafer arrangement region in which the wafers 200 are arranged, namely in a region which horizontally surrounds the wafer arrangement region, to extend along the wafer arrangement region. The nozzle 249b is disposed to face an exhaust port 231a, which will be described later, on a straight line in a plane view, with centers of the wafers 200 loaded into the process chamber 201 interposed therebetween. The nozzles 249a and 249c are disposed to sandwich a straight line L passing through the nozzle 249b and a center of the exhaust port 231a from both sides along the inner wall of the reaction tube 203 (an outer peripheral portion of the wafers 200). The straight line L is also a straight line passing through the nozzle 249b and the centers of the wafers 200. That is, it may be said that the nozzle 249c is installed at the opposite side of the nozzle 249a with the straight line L interposed therebetween. The nozzles 249a and 249c are disposed in line symmetry with the straight line L as a symmetry axis. Gas supply holes 250a to 250c configured to supply a gas are installed on the side surfaces of the nozzles 249a to 249c, respectively. The gas supply holes 250a to 250c are opened to face the exhaust port 231a in the plane view, thus allowing a gas to be supplied toward the wafers 200. The gas supply holes 250a to 250c may be formed in a plural number between the lower portion and the upper portion of the reaction tube 203.

A silicon (Si)-containing gas as a modifying gas is supplied from the gas supply pipe 232a into the process chamber 201 via the MFC 241a, the valve 243a, and the nozzle 249a. As the Si-containing gas, an aminosilane-based gas which is a gas containing Si and an amino group may be used. The amino group refers to a functional group obtained by coordinating one or two hydrocarbon groups containing one or more C atoms to one N atom (a functional group obtained by substituting one or both of H of an amino group represented by $NH_2$ by a hydrocarbon group containing one or more C atoms). When two hydrocarbon groups constituting a portion of the amino group are coordinated to one N, the two may be the same hydrocarbon group or different hydrocarbon groups. The hydrocarbon group may contain a single bond like an alkyl group, or may contain an unsaturated bond such as a double bond or a triple bond. The amino group may have a cyclic structure. Since the amino group is bonded to Si, which is a central atom of an aminosilane molecule, the amino group in aminosilane may be referred to as a ligand or an amino ligand. The aminosilane-based gas may further contain a hydrocarbon group, in addition to containing Si and an amino group. The hydrocarbon group may contain a single bond like an alkyl group, or may contain an unsaturated bond such as a double bond or a triple bond. The hydrocarbon group may have a cyclic structure. The hydrocarbon group may be bonded to Si, which is the central atom of the aminosilane molecule, and in this case, the hydrocarbon group in aminosilane may be referred to as a ligand or a hydrocarbon ligand. As the aminosilane-based gas, it may be possible to use, for example, a dimethylaminotrimethylsilane $((CH_3)_2NSi(CH_3)_3$, abbreviation: DMATMS) gas. In addition to one amino group (dimethylamino group) being bonded to Si, which is a central atom of DMATMS, three alkyl groups (methyl groups) are bonded to Si. That is, DMATMS contains one amino ligand and three alkyl ligands.

A halogen-containing gas is supplied from the gas supply pipe 232b into the process chamber 201 via the MFC 241b, the valve 243b, and the nozzle 249b. Halogen includes chlorine (Cl), fluorine (F), iodine (I), and the like. As the halogen-containing gas, it may be possible to use, for example, a fluorine ($F_2$) gas.

A gas containing oxygen (O) and hydrogen (H) is supplied from the gas supply pipe 232c into the process chamber 201 via the MFC 241c, the valve 243c, and the nozzle 249c. As the gas containing O and H, it may be possible to use, for example, water vapor ($H_2O$ gas).

An inert gas, for example, a nitrogen ($N_2$) gas, is supplied from the gas supply pipes 232d to 232f into the process chamber 201 via the MFCs 241d to 241f, the valves 243d to 243f, the gas supply pipes 232a to 232c, and the nozzles 249a to 249c respectively. The $N_2$ gas acts as a purge gas, a carrier gas, a dilution gas, or the like.

A modifying agent supply system mainly includes the gas supply pipe 232a, the MFC 241a, and the valve 243a. A halogen-containing gas supply system mainly includes the gas supply pipe 232b, the MFC 241b, and the valve 243b. An O- and H-containing gas supply system mainly includes the gas supply pipe 232c, the MFC 241c, and the valve 243c. An inert gas supply system mainly includes the gas supply pipes 232d to 232f, the MFCs 241d to 241f, and the valves 243d to 243f.

One or all of various supply systems described above may be configured as an integrated supply system 248 in which the valves 243a to 243f, the MFCs 241a to 241f, and the like are integrated. The integrated supply system 248 is connected to each of the gas supply pipes 232a to 232f so that a supply operation of various kinds of gases into the gas supply pipes 232a to 232f, i.e., an opening/closing operation of the valves 243a to 243f, a flow rate adjusting operation by the MFCs 241a to 241f or the like, is controlled by a controller 121 which will be described later. The integrated supply system 248 is configured as an integral type or division type integrated unit, and may be attached to or detached from the gas supply pipes 232a to 232f or the like on an integrated unit basis, such that maintenance, replacement, expansion or the like of the integrated supply system 248 may be performed on the integrated unit basis.

The exhaust port 231a configured to exhaust an internal atmosphere of the process chamber 201 is installed at a lower side of the sidewall of the reaction tube 203. As illustrated in FIG. 2, the exhaust port 231a is installed at a position facing the nozzles 249a to 249c (the gas supply holes 250a to 250c) in the plane view, with the wafers 200 interposed therebetween. The exhaust port 231a may be installed between the lower portion and the upper portion of the sidewall of the reaction tube 203, that is, along the wafer arrangement region. An exhaust pipe 231 is connected to the exhaust port 231a.

A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is configured so that a vacuum exhaust and a vacuum exhaust stop of the interior of the process chamber 201 can be performed by opening and closing the APC valve 244 while operating the vacuum pump 246 and so that the internal pressure of the process chamber 201 can be adjusted by adjusting an opening degree of the APC valve 244 based on pressure information detected by the pressure sensor 245 while operating the vacuum pump 246. An exhaust system mainly includes the exhaust pipe 231, the APC valve 244 and the pressure sensor 245. The vacuum pump 246 may be regarded as being included in the exhaust system.

A seal cap 219, which serves as a furnace opening lid configured to be capable of hermetically sealing a lower end opening of the manifold 209, is installed under the manifold 209. The seal cap 219 is made of a metal material such as stainless steel (SUS) or the like, and is formed in a disc shape. An O-ring 220b, which is a seal member making contact with the lower end portion of the manifold 209, is installed on an upper surface of the seal cap 219.

A rotation mechanism 267 configured to rotate a boat 217, which will be described later, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up or down by a boat elevator 115 which is an elevator mechanism installed outside the reaction tube 203. The boat elevator 215 is configured as a transfer device (transfer mechanism) which loads and unloads (transfers) the wafers 200 into and from (out of) the process chamber 201 by moving the seal cap 219 up or down.

A shutter 219s as a furnace opening lid capable of hermetically sealing the lower end opening of the manifold 209, with the boat 217 unloaded from the interior of the process chamber 201 by moving the seal cap 219 down, is installed under the manifold 209. The shutter 219s is made of a metal material such as stainless steel or the like, and is formed in a disc shape. An O-ring 220c as a seal member making contact with the lower end portion of the manifold 209 is installed on an upper surface of the shutter 219s. An opening/closing operation (an up-down movement operation or a rotational movement operation) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other. The boat 217 is made of a heat resistant material such as quartz or SiC.

Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a degree of supplying electric power to the heater 207 is adjusted such that the interior of the process chamber 201 has a desired temperature distribution. The temperature sensor 263 is installed along the inner wall of the reaction tube 203.

Figure 3:
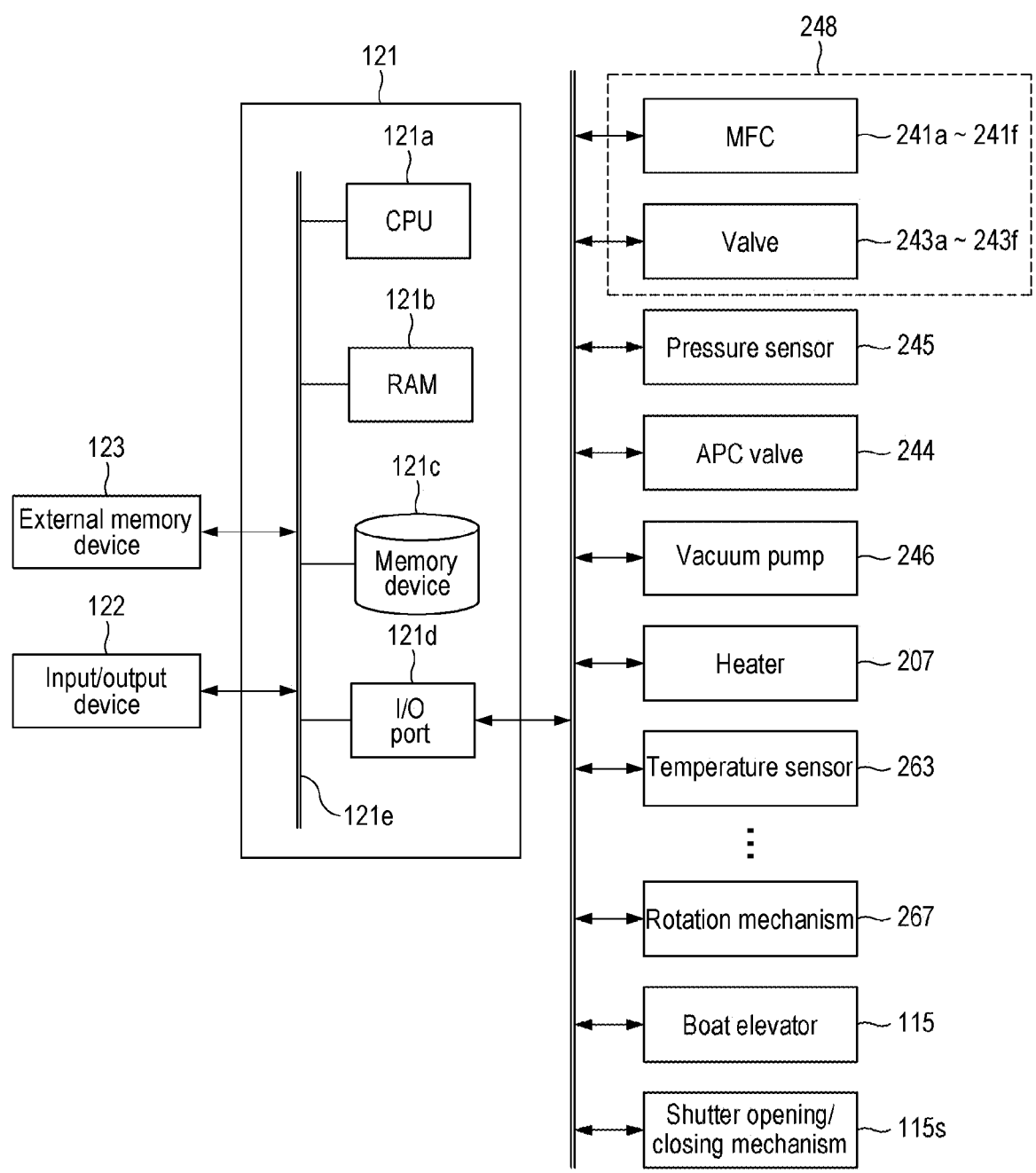
FIG. 3 is a schematic configuration diagram of a controller 121 of the substrate processing apparatus suitably used in an embodiment of the present disclosure, in which a control system of the controller 121 is shown in a block diagram.

As illustrated in FIG. 3, the controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to be capable of exchanging data with the CPU 121a via an internal bus 121e. An input/output device 122 configured as, for example, a touch panel or the like, is connected to the controller 121.

The memory device 121c includes, for example, a flash memory, a hard disk drive (HDD), or the like. A control program that controls operations of a substrate processing apparatus, a process recipe in which sequences, conditions and the like of substrate processing to be described below, and the like are readably stored in the memory device 121c. The process recipe functions as a program configured to be capable of causing the controller 121 to execute each sequence in the substrate processing, which will be described below, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data and the like read by the CPU 121a is temporarily stored.

The I/O port 121d is connected to the MFCs 241a to 241f, the valves 243a to 243f, the pressure sensor 245, the APC valve 244, the vacuum pump 246, the temperature sensor 263, the heater 207, the rotation mechanism 267, the boat elevator 115, the shutter opening/closing mechanism 115s, and the like, as described above.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the flow rate adjusting operation of various kinds of gases by the MFCs 241a to 241f, the opening/closing operation of the valves 243a to 243f, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 and adjusting the rotation speed of the boat 217 with the rotation mechanism 267, the operation of moving the boat 217 up or down with the boat elevator 115, the operation of opening and closing the shutter 219s with the shutter opening/closing mechanism 115s, and the like.

The controller 121 may be configured by installing, on the computer, the aforementioned program stored in an external memory device 123. The external memory device 123 may include, for example, a magnetic disc such as an HDD, an optical disc such as a CD, a magneto-optical disc such as an MO, a semiconductor memory such as a USB memory, and the like. The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer by using a communication means such as the Internet or a dedicated line, instead of using the external memory device 123.

(2) Substrate Processing

A processing sequence example of etching a base 200a exposed on a surface of a wafer 200 as a substrate by using the aforementioned substrate processing apparatus, which is a process for manufacturing a semiconductor device, will be described mainly with reference to FIGS. 4 and 5A to 5D. In the following descriptions, the operations of the respective parts constituting the substrate processing apparatus are controlled by the controller 121.

In the processing sequence illustrated in FIG. 4, a cycle, which includes non-simultaneously performing: a step of forming a modified layer 200b on a surface of the base 200a by supplying a DMATMS gas as a modifying agent to a base 200a exposed on a surface of a wafer 200 (DMATMS gas supply); and a step of causing a reaction between a F-containing radical (F*) as a halogen-containing radical and the base 200a by supplying a $F_2$ gas as a halogen-containing gas to the modified layer 200b such that the modified layer 200b reacts with the $F_2$ gas to generate the F-containing radical (F*) ($F_2$ gas supply), is performed a predetermined number of times (n times, where n is an integer of 1 or more).

Further, the cycle of the processing sequence illustrated in FIG. 4 performs a step of pre-processing the surface of the base 200a by supplying an $H_2O$ gas as a gas containing O and H to the base 200a exposed on the surface of the wafer 200 before performing the DMATMS gas supply ($H_2O$ gas supply).

Further, in the processing sequence illustrated in FIG. 4, each step is performed in a non-plasma atmosphere.

In the present disclosure, for the sake of convenience, the processing sequence described above may be denoted as follows. The same denotation will be used in the modifications and the like as described below.

($H_2O \rightarrow DMATMS \rightarrow F_2) \times n$

When the term "wafer" is used herein, it may refer to a wafer itself or a laminated body of a wafer and a layer or film formed on the surface of the wafer. In addition, when the phrase "a surface of a wafer" is used herein, it may refer to a surface of a wafer itself or a surface of a layer or the like formed on a wafer. Further, in the present disclosure, the expression "a layer is formed on a wafer" may mean that a layer is directly formed on a surface of a wafer itself or that a layer is formed on a layer or the like formed on a wafer. In addition, when the term "substrate" is used herein, it may be synonymous with the term "wafer."

Further, when the term "base" is used herein, it may refer to a wafer itself or a layer or film formed on the surface of the wafer. In addition, when the phrase "a surface of a base" is used herein, it may refer to a surface of a wafer itself or a surface of a layer or the like formed on the surface of the wafer. Furthermore, in the present disclosure, the expression "a layer is formed on a surface of a base" may mean that a layer is directly formed on a surface of a wafer itself or that a layer is formed on a surface of a layer or the like formed on the surface of the wafer.

(Wafer Charging and Boat Loading)

When a plurality of wafers 200 is charged on the boat 217 (wafer charging), the shutter 219s may be moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 via the O-ring 220b. Furthermore, for example, a silicon oxide film (SiO film) is exposed as the base 200a to be etched on the surface of each of the wafers 200.

(Pressure Regulation and Temperature Adjustment)

The interior of the process chamber 201, which is a space where the wafers 200 are placed, is vacuum-exhausted (depressurization-exhausted) by the vacuum pump 246 to reach a desired pressure (degree of vacuum). In this operation, the internal pressure of the process chamber 201 is measured by the pressure sensor 245. The APC valve 244 is feedback-controlled based on the measured pressure information. Further, the wafers 200 in the process chamber 201 are heated by the heater 207 to have a desired processing temperature. In this operation, the degree of supplying electric power to the heater 207 is feedback-controlled based on the temperature information detected by the temperature sensor 263 so that the interior of the process chamber 201 has a desired temperature distribution. Further, the rotation of the wafers 200 by the rotation mechanism 267 begins. The exhaust of the interior of the process chamber 201 and the heating and rotation of the wafers 200 may be all continuously performed at least until the processing of the wafers 200 is completed.

(Etching)

Next, the following steps 1 to 3 are sequentially performed.

[Step 1]

At this step, an $H_2O$ gas is supplied to the wafer 200 in the process chamber 201, that is, to the base 200a exposed on the surface of the wafer 200.

Specifically, the valve 243c is opened to allow an $H_2O$ gas to flow through the gas supply pipe 232c. A flow rate of the $H_2O$ gas is adjusted by the MFC 241c. The $H_2O$ gas is supplied into the process chamber 201 via the nozzle 249c and is exhausted from the exhaust port 231a. At this time, the $H_2O$ gas is supplied to the wafer 200 ($H_2O$ gas supply). Simultaneously, the valves 243d to 243f may be opened to supply an $N_2$ gas into the process chamber 201 via the nozzles 249a to 249c respectively.

Figure 5A:
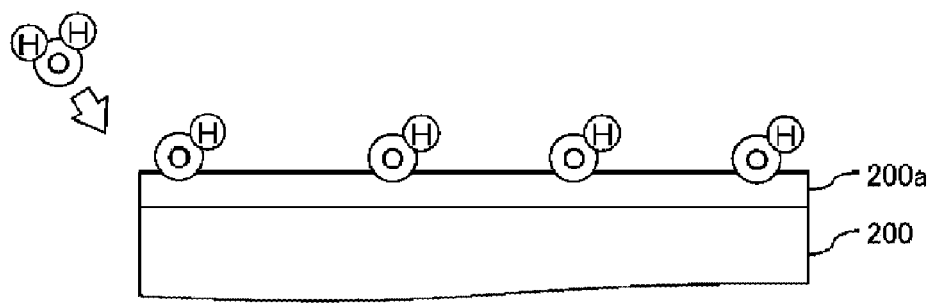
FIG. 5A is a partial enlarged cross-sectional view of a surface of a wafer 200 illustrating a state in which a surface of a base 200a is OH-terminated by pre-processing the surface of the base 200a exposed on the surface of the wafer 200.

By supplying the $H_2O$ gas to the wafer 200 under a condition to be described below, the surface of the base 200a exposed on the surface of the wafer 200 can be pre-processed. Specifically, as illustrated in FIG. 5A, the surface of the base 200a can be terminated with a hydroxy group (OH group), that is, OH-terminated. Further, the OH termination formed on the surface of the base 200a functions as an adsorption site that promotes adsorption of Si contained in the DMATMS gas on the surface of the base 200a in the DMATMS gas supply to be described below.

After the surface of the base 200a is pre-processed, the valve 243c is closed to stop the supply of the H$_2$O gas into the process chamber 201. Then, the interior of the process chamber 201 is vacuum-exhausted and the gas or the like remaining within the process chamber 201 is removed from the interior of the process chamber 201. At this time, the valves 243d to 243f are opened to supply an N$_2$ gas into the process chamber 201 via the nozzles 249a to 249c. The N$_2$ gas supplied from the nozzles 249a to 249c acts as a purge gas. Thus, the interior of the process chamber 201 is purged (purge).

The processing condition in the H$_2$O gas supply may be exemplified as follows:

H$_2$O gas supply flow rate: 10 to 2,000 sccm
Supply time of H$_2$O gas: 5 to 1,800 seconds
N$_2$ gas supply flow rate (per gas supply pipe): 0 to 10,000 sccm
Processing temperature: 30 to 300 degrees C.
Processing pressure: 5 to 1,000 Pa.

Furthermore, in the present disclosure, an expression of a numerical range such as "5 to 1,000 Pa" may mean that a lower limit value and an upper limit value are included in that range. Therefore, for example, "5 to 1,000 Pa" may mean "5 Pa or more and 1,000 Pa or less". The same applies to other numerical ranges.

As the gas containing O and H, it may be possible to use, in addition to the H$_2$O gas, for example, an O-containing gas containing an O—H bond such as a hydrogen peroxide (H$_2$O$_2$) gas or the like, that is, a gas containing an OH group. Further, as the gas containing O and H, it may be possible to use an O-containing gas and an H-containing gas such as an O$_2$ gas+H$_2$ gas.

As the inert gas, in addition to the N$_2$ gas, a rare gas such as an Ar gas, a He gas, a Ne gas, a Xe gas or the like may be used. This also applies to each step to be described below.

[Step 2]

After step 1 is completed, a DMATMS gas is supplied to the wafer 200 in the process chamber 201, that is, to the base 200a whose surface is OH-terminated.

Specifically, the valve 243a is opened to allow a DMATMS gas to flow through the gas supply pipe 232a. A flow rate of the DMATMS gas is adjusted by the MFC 241a. The DMATMS gas is supplied into the process chamber 201 via the nozzle 249a and is exhausted from the exhaust port 231a. At this time, the DMATMS gas is supplied to the wafer 200 (DMATMS gas supply). At this time, the valves 243d to 243f may be opened to supply an N$_2$ gas into the process chamber 201 via the nozzles 249a to 240c respectively.

Figure 5B:
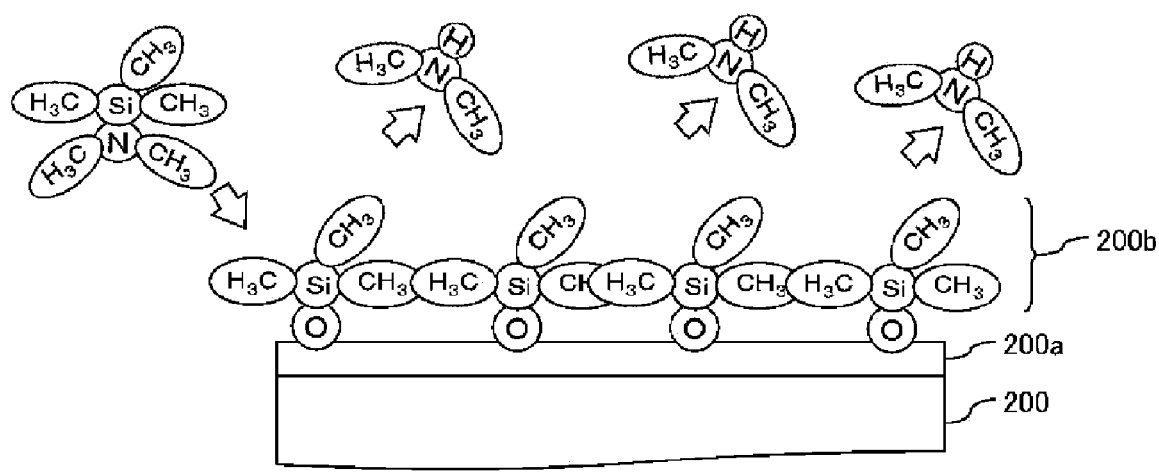
FIG. 5B is a partial enlarged cross-sectional view of the surface of the wafer 200 illustrating a state in which a modified layer 200b is formed on the surface of the base 200a by supplying a modifying agent to the base 200a having a surface OH-terminated.

By supplying the DMATMS gas to the wafer 200 under a condition to be described below, as illustrated in FIG. 5B, the surface of the base 200a can be modified to allow Si contained in the DMATMS gas, that is, Si contained in aminosilane, to be adsorbed on the surface of the base 200a. Thus, a modified layer 200b can be formed on the surface of the base 200a. Further, the modification referred to herein may mean that the DMATMS gas is physisorbed or chemisorbed on atoms of the surface layer of the base 200a or that the DMATMS gas and the atoms on the surface layer of the base 200a are chemically reacted with each other to form a compound. In addition, Si adsorbed on the surface of the base 200a acts to promote the generation of a fluorine radical (F*) contributing to the etching of the base 200a in the F$_2$ gas supply to be described below.

When the supply of the DMATMS gas is continued for a predetermined time, the adsorption of Si on the surface of the base 200a is saturated. That is, the adsorption of Si on the surface of the base 200a is self-limited. In other words, when a Si layer having a predetermined saturation thickness of one atomic layer or less than one atomic layer is formed on the surface of the base 200a, Si is no longer adsorbed on the surface of the base 200a. The amount of Si adsorbed on the surface of the base 200a, that is, the amount of Si contained in the modified layer 200b, becomes a substantially uniform amount over the entire surface of the base 200a. This is because the processing condition at this step is set to a condition under which the DMATMS gas is not gas-phase decomposed in the process chamber 201, as will be described later. At this step, since the DMATMS gas is not gas-phase decomposed in the process chamber 201, multiple deposition of Si contained in DMATMS on the surface of the base 200a is suppressed. Further, by supplying the DMATMS gas under such a processing condition, the modified layer 200b formed on the surface of the base 200a becomes a layer containing a hydrocarbon group such as an alkyl group (a methyl group in this case), in addition to Si contained in the DMATMS gas. Further, the surface of the modified layer 200b is terminated with a hydrocarbon group or the like. In addition, when Si contained in the DMATMS gas is adsorbed on the base 200a, the amino group (a dimethylamino group in this case) or the like desorbed from Si is combined with H or the like contained in the OH group terminating the surface of the base 200a to become a gaseous substance and is exhausted from the exhaust port 231a.

After the formation of the modified layer 200b on the surface of the base 200a is completed, the valve 243a is closed to stop the supply of the DMATMS gas into the process chamber 201. Then, the interior of the process chamber 201 is vacuum-exhausted and the gas or the like, which remains within the process chamber 201, is removed from the interior of the process chamber 201 according to the same processing procedure as that of the purge at step 1 (purge).

The processing condition in the DMATMS gas supply may be exemplified as follows:

DMATMS gas supply flow rate: 10 to 2,000 sccm
Supply time of DMATMS gas: 5 to 1,800 seconds
Processing temperature: 30 to 300 degrees C., specifically 30 to 200 degrees C. in some embodiments
Processing pressure: 1 to 5,000 Pa, specifically 5 to 1,000 Pa in some embodiments.

Other processing conditions may be similar to the processing conditions in the H$_2$O gas supply of step 1. As described above, the condition described herein is the condition under which the DMATMS gas is not gas-phase decomposed in the process chamber 201, that is, a condition under which the adsorption of Si on the surface of the base 200a is self-limited and the adsorption of Si is saturated.

As the modifying agent, it may be possible to use, in addition to the DMATMS gas, for example, the aminosilane-based gas represented by the following chemical formula [1].

$$SiA_x[(NB_2)_{(4-x)}] \quad [1]$$

In the formula [1], A indicates a hydrogen atom, an alkyl group such as a methyl group, an ethyl group, a propyl group or a butyl group, or an alkoxy group such as a methoxy group, an ethoxy group, a propoxy group or a butoxy group. The alkyl group may be not only a linear alkyl group but also a branched alkyl group such as an isopropyl group, an isobutyl group, a secondary butyl group, a tertiary butyl group or the like. The alkoxy group may be not only a linear alkoxy group but also a branched alkoxy group such as an isopropoxy group, an isobutoxy group or the like. B indicates a hydrogen atom or an alkyl group such as a methyl group, an ethyl group, a propyl group, a butyl group or the like. The alkyl group may be not only a linear alkyl group but also a branched alkyl group such as an isopropyl group, an isobutyl group, a secondary butyl group, a tertiary butyl group or the like. A plurality of A's may be identical or different, and two B's may be identical or different. Further, x is an integer of 1 to 3.

[Step 3]

After step 2 is completed, a $F_2$ gas is supplied to the wafer 200 in the process chamber 201, namely to the modified layer 200b formed on the surface of the base 200a.

Specifically, the valve 243b is opened to allow the $F_2$ gas to flow through the gas supply pipe 232b. A flow rate of the $F_2$ gas is adjusted by the MFC 241b. The $F_2$ gas is supplied into the process chamber 201 via the nozzle 249b and is exhausted from the exhaust port 231a. At this time, the $F_2$ gas is supplied to the wafer 200 ($F_2$ gas supply). At this time, the valves 243d to 243f may be opened to supply a $N_2$ gas into the process chamber 201 via the nozzles 249a to 249c respectively.

Figure 5C:
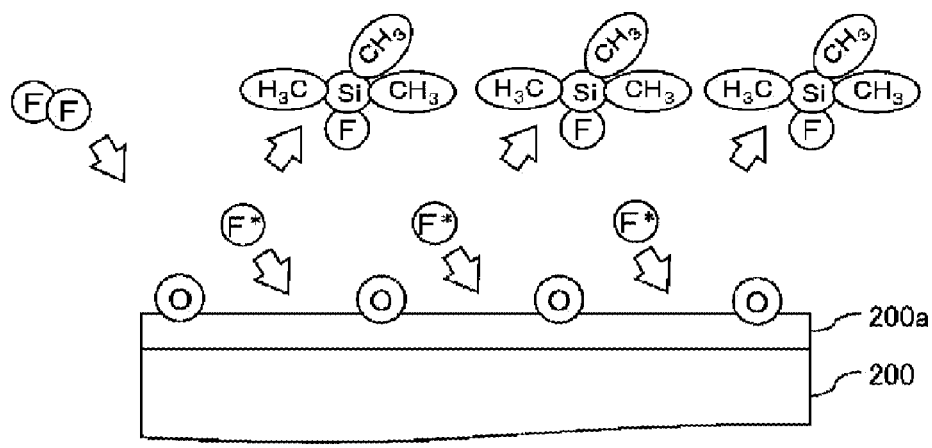
FIG. 5C is a partial enlarged cross-sectional view of the surface of the wafer 200 illustrating a state in which a halogen-containing radical is generated by supplying a halogen-containing gas to the modified layer 200b such that the modified layer 200b reacts with the halogen-containing gas, and the halogen-containing radical reacts with the base 200a, and FIG. 5D is a partial enlarged cross-sectional view of the surface of the wafer 200 after a surface layer of the base 200a is etched by the reaction with the halogen-containing radical.

By supplying the $F_2$ gas to the wafer 200 under a condition to be described below, as illustrated in FIG. 5C, the modified layer 200b may react with the $F_2$ gas to generate a fluorine-containing radical (F*), thus causing a reaction between the F* and the base 200a. Then, the surface of the base 200a may be etched with the F* generated by the reaction between the modified layer 200b and the $F_2$ gas. The Si contained in the modified layer 200b is desorbed from the surface of the base 200a by the reaction with the $F_2$ gas and is exhausted from the exhaust port 231a, for example, by forming a compound with F.

Further, by etching the base 200a with F* generated by the reaction between the modified layer 200b and the $F_2$ gas, it is possible to enhance a controllability of an etching amount when etching the base 200a. This is because when all Si contained in the modified layer 200b is desorbed (consumed) from the base 200a by the aforementioned reaction, the generation of F* is terminated. Therefore, by controlling the amount of Si contained in the modified layer 200b to be a predetermined amount as in the present embodiment, the amount of F* generated per this step can be limited to become a corresponding amount, and as a result, the etching amount of the base 200a with F* per this step can be precisely controlled. As in the present embodiment, when the amount of Si contained in the modified layer 200b in the DMATMS gas supply is set to a constant amount of one atomic layer or less than one atomic layer over the entire in-plane region of the wafer, the amount of F* generated per this step becomes a constant amount corresponding to the amount over the entire in-plane region of the wafer, and as a result, the etching amount of the base 200a with F* can be controlled to be a constant amount of, for example, one atomic layer (molecular layer) or less than one atomic layer (molecular layer), over the entire in-plane region of the wafer.

The processing condition in the $F_2$ gas supply may be exemplified as follows:

$F_2$ gas supply flow rate: 10 to 1,000 sccm
Supply time of $F_2$ gas: 5 to 600 seconds
Processing temperature: 30 to 250 degrees C., specifically 30 to 200 degrees C. in some embodiments
Processing pressure: 5 to 1,000 Pa.

Other conditions may be similar to the processing conditions in the $H_2O$ gas supply of step 1.

Further, the processing condition at this step is set to a condition under which the reaction between the $F_2$ gas and the modified layer 200b proceeds further than the reaction between the $F_2$ gas and the base 200a. In other words, the processing condition at this step is set to a condition under which an amount of $F_2$ gas that reacts with the modified layer 200b in the reaction between the $F_2$ gas and the modified layer 200b is larger than an amount of $F_2$ gas that reacts with the base 200a in the reaction between the $F_2$ gas and the base 200a. This makes it possible to promote the generation of F* contributing to the etching of the base 200a while suppressing a direct etching of the base 200a with the $F_2$ gas. As a result, it is possible to further enhance the controllability of the etching amount when etching the base 200a.

Further, the processing condition at this step can be set to a condition under which the reaction between the $F_2$ gas and the modified layer 200b proceeds and the reaction between the $F_2$ gas and the base 200a does not proceed. This makes it possible to promote the generation of F* contributing to the etching of the base 200a while reliably suppressing the direct etching of the base 200a with the $F_2$ gas. As a result, it is possible to further enhance the controllability of the etching amount when etching the base 200a.

Further, the processing condition at this step is set to a condition under which the reaction between F* and the base 200a proceeds further than the reaction between the $F_2$ gas and the base 200a. In other words, the processing condition at this step is set to a condition under which an amount of F* that reacts with the base 200a in the reaction between F* and the base 200a is larger than an amount of $F_2$ gas that reacts with the base 200a in the reaction between the $F_2$ gas and the base 200a. This makes it possible to suppress the direct etching of the base 200a with the $F_2$ gas and to allow the etching reaction of the base 200a with F* to occur dominantly. As a result, it is possible to further enhance the controllability of the etching amount when etching the base 200a.

Further, the processing condition in this step can be set to a condition under which the reaction between F* and the base 200a proceeds and the reaction between the $F_2$ gas and the base 200a does not proceed. This makes it possible to reliably suppress the direct etching of the base 200a with the $F_2$ gas and to allow the etching reaction of the base 200a with F* to occur more dominantly. As a result, it is possible to further enhance the controllability of the etching amount when etching the base 200a.

After the etching of the base 200a with F* generated by the reaction between the modified layer 200b and the $F_2$ gas is completed, the valve 243b is closed to stop the supply of the $F_2$ gas into the process chamber 201. Then, the interior of the process chamber 201 is vacuum-exhausted such that the gas or the like, which remains within the process chamber 201, is removed from the interior of the process chamber 201 according to the same processing procedure as that of the purge at step 1 (purge).

As the halogen-containing gas, it may be possible to use, in addition to the $F_2$ gas, a chlorine trifluoride ($ClF_3$) gas, a nitrosyl fluoride (FNO) gas, a chlorine fluoride (ClF) gas, a nitrogen trifluoride ($NF_3$) gas, a hydrogen fluoride (HF) gas, a chlorine ($Cl_2$) gas, a hydrogen chloride (HCl) gas, an iodine heptafluoride ($IF_7$) gas, an iodine pentafluoride ($IF_5$) gas, or the like. These gases may react with the modified layer 200b to generate a chlorine-containing radical (Cl*), an iodine-containing radical (I*) or the like, in addition to F*, as the halogen-containing radical, and these radicals may react with the base 200a to proceed the etching of the base 200a.

[Performing a Predetermined Number of Times]

Figure 5D:
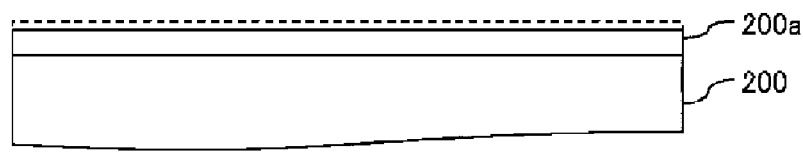

A cycle which non-simultaneously, that is, non-synchronously, performs steps 1 to 3 described above is performed a predetermined number of times (n times, where n is an integer of 1 or more). Thus, the base 200a exposed on the surface of the wafer 200 can be etched at a desired depth, as illustrated in FIG. 5D. The aforementioned cycle may be repeated multiple times. That is, a thickness of a layer etched per one cycle may be set smaller than a desired thickness, and the aforementioned cycle may be repeated multiple times until a thickness of a layer removed by etching becomes equal to the desired thickness.

(After-Purge and Returning to Atmospheric Pressure)

After the etching of the base 200a is completed, the $N_2$ gas as a purge gas is supplied from each of the nozzles 249a to 249c into the process chamber 201 and is exhausted from the exhaust port 231a. Thus, the interior of the process chamber 201 is purged and the gas or the reaction byproduct, which remains within the process chamber 201, is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (returning to atmospheric pressure).

(Boat Unloading and Wafer Discharging)

Thereafter, the seal cap 219 is moved down by the boat elevator 115 to open the lower end of the manifold 209. Then, the processed wafers 200 supported on the boat 217 are unloaded from the lower end of the manifold 209 to the outside of the reaction tube 203 (boat unloading). After the boat unloading, the shutter 219s is moved so that the lower end opening of the manifold 209 is sealed by the shutter 219s via the O-ring 220c (shutter closing). The processed wafers 200 are unloaded to the outside of the reaction tube 203, and then are subsequently discharged from the boat 217 (wafer discharging).

(3) Effects According to the Embodiments

According to the embodiments, one or more effects as set forth below may be achieved.

(a) By performing a cycle a predetermined number of times, the cycle including non-simultaneously performing: supplying the DMATMS gas to form the modified layer 200b on the surface of the base 200a exposed on the surface of the wafer 200; and supplying the $F_2$ gas to cause the reaction between the base 2001 and F* generated by the reaction between the modified layer 200b and the $F_2$ gas, it is possible to precisely control the etching amount of the base 200a. That is, by etching the base 200a with F* generated by the reaction between the modified layer 200b and the $F_2$ gas, it is possible to control the etching amount of the base 200a at a level of, for example, one atomic layer (molecular layer) or less.

(b) By supplying the $F_2$ gas under the condition in which the reaction between the $F_2$ gas and the modified layer 200b proceeds further than the reaction between the $F_2$ gas and the base 200a (that is, the condition in which an amount of $F_2$ gas that reacts with the modified layer 200b in the reaction between the $F_2$ gas and the modified layer 200b is larger than an amount of $F_2$ gas that reacts with the base 200a in the reaction between the $F_2$ gas and the base 200a), it is possible to suppress the etching amount of the base 200a from fluctuating depending on an exposure amount of the $F_2$ gas. As a result, it is possible to further enhance the controllability of the etching amount when etching the base 200a. For example, by supplying the $F_2$ gas under the aforementioned processing condition even under a situation where a 3D structure such as a trench or a hole is formed on the surface of the base 200a and the exposure amount of the $F_2$ gas is likely to be locally reduced or under a situation where a partial pressure of the $F_2$ gas in the process chamber 201 is not constant depending on a position, it is possible to control the etching amount of the base 200a to be uniform over the in-plane of the wafer.

(c) By supplying the $F_2$ gas under the condition in which the reaction between the $F_2$ gas and the modified layer 200b proceeds and the reaction between the $F_2$ gas and the base 200a does not proceed, it is possible to reliably suppress the etching amount of the base 200a from fluctuating depending on an exposure amount of the $F_2$ gas. As a result, it is possible to further enhance the controllability of the etching amount when etching the base 200a. For example, by supplying the $F_2$ gas under the aforementioned processing condition even under a situation where a 3D structure such as a trench or a hole is formed on the surface of the base 200a and the exposure amount of the $F_2$ gas is likely to be locally reduced or under a situation where the partial pressure of the $F_2$ gas in the process chamber 201 is not constant depending on a position, it is possible to reliably control the etching amount of the base 200a to be uniform over the in-plane of the wafer.

(d) By supplying the $F_2$ gas supply under the condition in which the reaction between F* and the base 200a proceeds further than the reaction between the $F_2$ gas and the base 200a (that is, the condition in which an amount of F* that reacts with the base 200a in the reaction between F* and the base 200a is larger than an amount of $F_2$ gas that reacts with the base 200a in the reaction between the $F_2$ gas and the base 200a), it is possible to suppress the etching amount of the base 200a from fluctuating depending on an exposure amount of the $F_2$ gas. As a result, it is possible to further enhance the controllability of the etching amount when etching the base 200a. For example, by supplying the $F_2$ gas under the aforementioned processing condition even under a situation where a 3D structure such as a trench or a hole is formed on the surface of the base 200a and the exposure amount of the $F_2$ gas is likely to be locally reduced or under a situation where the partial pressure of the $F_2$ gas in the process chamber 201 is not constant depending on a position, it is possible to control the etching amount of the base 200a to be uniform over the in-plane of the wafer.

(e) By supplying the $F_2$ gas under the condition in which the reaction between F* and the base 200a proceeds and the reaction between the $F_2$ gas and the base 200a does not proceed, it is possible to reliably suppress the etching amount of the base 200a from fluctuating depending on an exposure amount of the $F_2$ gas. As a result, it is possible to further enhance the controllability of the etching amount when etching the base 200a. For example, by supplying the $F_2$ gas under the aforementioned processing condition even under a situation where a 3D structure such as a trench or a hole is formed on the surface of the base 200a and the exposure amount of the $F_2$ gas is likely to be locally reduced or under a situation where the partial pressure of the $F_2$ gas in the process chamber 201 is not constant depending on a position, it is possible to reliably control the etching amount of the base 200a to be uniform over the in-plane of the wafer.

(f) In the DMATMS gas supply, Si contained in the DMATMS gas is adsorbed on the surface of the base 200a by using the DMATMS gas, which is the Si-containing gas, as the modifying agent, whereby it is possible to promote the generation of F* contributing to the etching of the base 200a in the subsequent $F_2$ gas supply. As a result, it is possible to further enhance the controllability of the etching amount when etching the base 200a.

(g) In the DMATMS gas supply, Si contained in the DMATMS gas is adsorbed on the surface of the base 200a by using the DMATMS gas, which is the aminosilane-based gas, as the modifying agent, whereby it is possible to improve the uniformity in the thickness of the modified layer 200b formed on the surface of the base 200a in the plane of the wafer, that is, the uniformity of the adsorption amount of Si in the plane of the wafer. This makes it possible to make the amount of F* generated in the $F_2$ gas supply uniform in the plane of the wafer. As a result, it is possible to further enhance the controllability of the etching amount when etching the base 200a over the in-plane of the wafer, and to reliably control the etching amount of the base 200a at a level of, for example, one atomic layer (molecular layer) or less, over the in-plane of the wafer.

(h) In the DMATMS gas supply, the DMATMS gas is supplied under the condition in which the adsorption of Si on the surface of the base 200a is saturated, that is, the condition in which the adsorption of Si is self-limited, whereby it is possible to further improve uniformity of the thickness of the modified layer 200b formed on the surface of the base 200a in the plane of the wafer, that is, the uniformity of the adsorption amount of Si in the plane of the wafer. Thus, it possible to make the amount of F* generated in the $F_2$ gas supply uniform in the plane of the wafer. As a result, it is possible to further enhance the controllability of the etching amount when etching the base 200a over the in-plane of the wafer, and to reliably control the etching amount of the base 200a at a level of, for example, one atomic layer (molecular layer) or less, over the in-plane of the wafer.

(i) By performing the $H_2O$ gas supply which pre-processes the surface of the base 200a and OH-terminates the same before performing the DMATMS gas supply, it is possible to promote the formation of the modified layer 200b on the surface of the base 200a in the subsequent DMATMS gas supply.

(j) By performing each step in a non-plasma atmosphere, it is possible to enhance the controllability of the processing at each step, and as a result, to further enhance the controllability of the etching amount. Further, it is also possible to avoid plasma damage to the wafer 200 or to each base exposed on the surface of the wafer 200.

(k) The effects mentioned above can be similarly achieved in the case where a modifying agent other than the DMATMS gas is used, in the case where a halogen-containing gas other than the $F_2$ gas is used, in the case where a gas containing O and H other than the $H_2O$ gas is used, or in the case where an inert gas other than the $N_2$ gas is used.

Other Embodiments of the Present Disclosure

While embodiments of the present disclosure have been specifically described above, the present disclosure is not limited to the aforementioned embodiments but may be variously modified without departing from the spirit of the present disclosure.

For example, the $H_2O$ gas supply may not be performed in each cycle as in a substrate processing sequence described below. Even in this case, the same effects as those of the aforementioned embodiments may be achieved. Further, it is possible to shorten a cycle time and to improve a productivity of substrate processing. However, in the DMATMS gas supply, the $H_2O$ gas supply may be performed before performing the DMATMS gas supply, as in the aforementioned embodiments to promote the formation of the modified layer 200b on the surface of the base 200a exposed on the surface of the wafer 200.

$$(DMATMS \rightarrow F_2) \times n$$

Further, for example, the base 200a exposed on the surface of the wafer 200 is not limited to the SiO film but may be a film containing a semi-metal element such as a silicon oxycarbonitride film (SiOCN film), a silicon oxynitride film (SiON film), a silicon oxycarbide film (SiOC film), a silicon nitride film (SiN film), a silicon carbide film (SiC film), a silicon carbonitride film (SiCN film), a silicon boronitride film (SiBN film), a silicon borocarbonitride film (SiBCN film), a germanium film (Ge film) or a silicon germanium film (SiGe film), or a film containing a metal element such as a titanium nitride film (TiN film) or a tungsten film (W film). Even in these cases, the same effects as those of the aforementioned embodiments may be achieved.

Recipes used in each processing may be provided individually according to the processing contents and may be stored in the memory device 121c via a telecommunication line or the external memory device 123. Moreover, at the start of each processing, the CPU 121a may properly select an appropriate recipe from the recipes stored in the memory device 121c according to the processing contents. Thus, it is possible for a single substrate processing apparatus to realize various etching processes with enhanced reproducibility. In addition, it is possible to reduce an operator's burden and to quickly start each processing while avoiding an operation error.

The recipes mentioned above are not limited to newly-prepared ones but may be provided by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there has been described an example in which the etching process is performed by using a batch-type substrate processing apparatus capable of processing a plurality of substrates at a time. The present disclosure is not limited to the aforementioned embodiments but may be appropriately applied to, for example, a case where the etching process is performed by using a single-wafer-type substrate processing apparatus capable of processing a single substrate or several substrates at a time. In addition, in the aforementioned embodiments, there has been described an example in which the etching process is performed by using the substrate processing apparatus provided with a hot-wall-type process furnace. The present disclosure is not limited to the aforementioned embodiments but may be appropriately applied to a case where the etching process is performed by using a substrate processing apparatus provided with a cold-wall-type process furnace.

Even in the case of using these substrate processing apparatuses, each processing may be performed with processing sequences and processing conditions similar to those of the embodiments described above to achieve effects similar to those of the aforementioned embodiments may be achieved.

The embodiments described above may be appropriately combined with one another. The processing procedures and processing conditions at this time may be similar to, for example, the processing procedures and processing conditions of the aforementioned embodiments.

Example

A SiO film and a SiN film, which are bases exposed on a surface of a wafer, are etched and their etching amounts are measured respectively by using the aforementioned substrate processing apparatus and by the gas supply sequence illustrated in FIG. 4. The processing condition is set to a predetermined condition which falls within a range of the processing condition described in the aforementioned embodiments.

Figure 6:
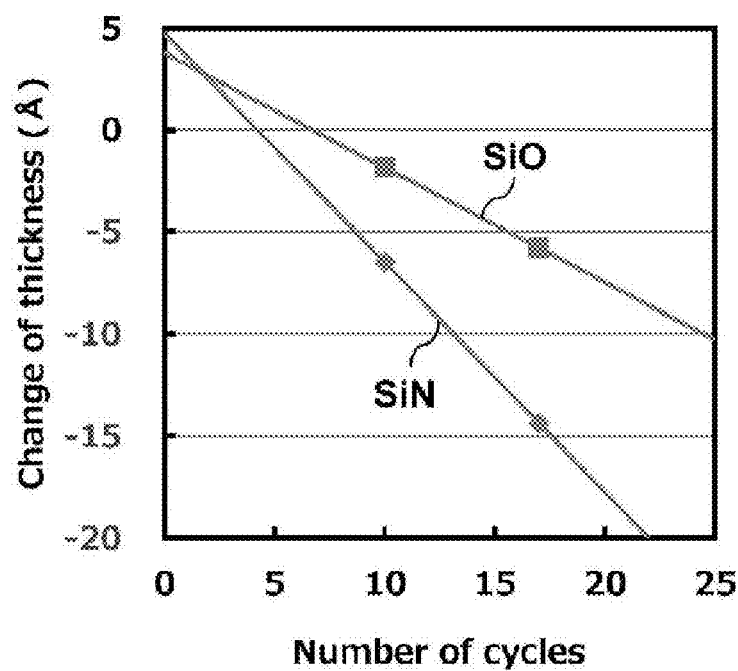
FIG. 6 is a view illustrating measurement results of an etching rate of the base.

FIG. 6 shows measurement results of etching amounts. In FIG. 6, a horizontal axis indicates the number of times that a cycle including steps 1 to 3 is performed and a vertical axis indicates an amount of change in a film thickness of the base, that is, an etching amount (Å) of the base. In FIG. 6, ■ marks indicate a measurement result of the SiO film, and ♦ marks indicate a measurement result of the SiN film.

As shown in FIG. 6, it can be seen that, in both the SiO film and the SiN film, the etching amount per one cycle can be kept within the range of 0.5 to 1 Å, that is, the etching amount of the base can be controlled at a level of, for example, one atomic layer (molecular layer) or less.

According to the present disclosure in some embodiments, it is possible to enhance etching controllability.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   etching a base exposed on a surface of a substrate by performing a cycle a predetermined number of times, the cycle including non-simultaneously performing:
   (a) forming a modified layer on a surface of the base by supplying a modifying agent to the base; and
   (b) causing a reaction between a halogen-containing radical and the base by supplying a halogen-containing gas to the modified layer such that the modified layer reacts with the halogen-containing gas to generate the halogen-containing radical.

2. The method according to claim 1, wherein in (b), the halogen-containing gas is supplied under a condition in which an amount of the halogen-containing gas that reacts with the modified layer in the reaction between the halogen-containing gas and the modified layer is larger than an amount of the halogen-containing gas that reacts with the base in the reaction between the halogen-containing gas and the base.

3. The method according to claim 1, wherein in (b), the halogen-containing gas is supplied under a condition in which the reaction between the halogen-containing gas and the modified layer proceeds and the reaction between the halogen-containing gas and the base does not proceed.

4. The method according to claim 1, wherein in (b), the base is etched with the halogen-containing radical generated by the reaction between the halogen-containing gas and the modified layer.

5. The method according to claim 4, wherein in (b), the halogen-containing gas is supplied under a condition in which an amount of the halogen-containing radical that reacts with the base in the reaction between the halogen-containing radical and the base is larger than an amount of the halogen-containing gas that reacts with the base in the reaction between the halogen-containing gas and the base.

6. The method according to claim 4, wherein in (b), the halogen-containing gas is supplied under a condition in which the reaction between the halogen-containing radical and the base proceeds and the reaction between the halogen-containing gas and the base does not proceed.

7. The method according to claim 1, wherein the modifying agent includes a silicon-containing gas, and
   wherein in (a), silicon contained in the silicon-containing gas is adsorbed on the surface of the base.

8. The method according to claim 1, wherein the modifying agent includes aminosilane, and
   wherein in (a), silicon contained in the aminosilane is adsorbed on the surface of the base.

9. The method according to claim 7, wherein in (a), the modifying agent is supplied under a condition in which the adsorption of the silicon on the surface of the base is saturated.

10. The method according to claim 7, wherein in (a), the modifying agent is supplied under a condition in which the adsorption of the silicon on the surface of the base is self-limited.

11. The method according to claim 8, wherein in (a), the modifying agent is supplied under a condition in which the adsorption of the silicon on the surface of the base is saturated.

12. The method according to claim 1, wherein the cycle further includes (c) pre-processing the surface of the base before performing (a).

13. The method according to claim 12, wherein in (c), an adsorption site is formed on the surface of the base.

14. The method according to claim 1, wherein the cycle further includes (c) OH-terminating the surface of the base before performing (a).

15. The method according to claim 12, wherein in (c), a gas containing oxygen and hydrogen is supplied to the substrate.

16. The method according to claim 1, wherein the halogen-containing gas includes at least one selected from the group of a fluorine-containing gas, a chlorine-containing gas, and an iodine-containing gas.

17. The method according to claim 1, wherein the halogen-containing radical includes at least one selected from the group of a fluorine-containing radical, a chlorine-containing radical, and an iodine-containing radical.

18. The method according to claim 1, wherein the base contains at least one selected from the group of a semi-metal element and a metal element.

19. A non-transitory computer-readable recording medium storing a program that causes, by a computer, a substrate processing apparatus to perform a process in a process chamber of the substrate processing apparatus, the process comprising:

etching a base exposed on a surface of a substrate by performing a cycle a predetermined number of times, the cycle including non-simultaneously performing:
(a) forming a modified layer on a surface of the base by supplying a modifying agent to the base; and
(b) causing a reaction between a halogen-containing radical and the base by supplying a halogen-containing gas to the modified layer such that the modified layer reacts with the halogen-containing gas to generate the halogen-containing radical.

* * * * *